US007443325B2

(12) United States Patent
Hong

(10) Patent No.: US 7,443,325 B2
(45) Date of Patent: Oct. 28, 2008

(54) SIGMA-DELTA MODULATOR

(75) Inventor: Merit Y. Hong, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/979,089

(22) Filed: Oct. 31, 2007

(65) Prior Publication Data

US 2008/0068241 A1 Mar. 20, 2008

Related U.S. Application Data

(63) Continuation of application No. 11/453,200, filed on Jun. 15, 2006, now Pat. No. 7,315,268.

(51) Int. Cl.
*H03M 3/00* (2006.01)
(52) U.S. Cl. .................. 341/143; 341/142; 324/458; 324/522; 375/350
(58) Field of Classification Search .............. 341/51, 341/50, 142, 143; 324/522, 458; 375/350
See application file for complete search history.

(56) References Cited

U.S. PATENT DOCUMENTS

| 5,243,345 | A | | 9/1993 | Naus et al. |
|---|---|---|---|---|
| 5,646,520 | A | * | 7/1997 | Frank et al. .............. 324/158.1 |
| 5,815,537 | A | | 9/1998 | Janssen |
| 6,140,950 | A | | 10/2000 | Oprescu |
| 6,624,671 | B2 | * | 9/2003 | Fotouhi ..................... 327/112 |
| 7,034,542 | B2 | | 4/2006 | Peterson |
| 7,230,431 | B2 | | 6/2007 | Mirme |
| 2005/0184721 | A1 | | 8/2005 | Peterson |

OTHER PUBLICATIONS

Van Veldhoven, Robert H.M. "A Triple-Mode Continuous-Time ΣΔ Modulator With Switched-Capacitor Feedback DAC for a GSM-EDGE/CDMA2000/UMTS Receiver" *IEEE Journal of Solid-State Circuits*, vol. 38, No. 12, (Dec. 2003).

* cited by examiner

*Primary Examiner*—Jean B Jeanglaude

(57) ABSTRACT

An integrator circuit (110) is provided including an amplifier element (170) configured to receive an input signal at an input node, amplify the input signal, and provide an amplified input signal at an output node; a feedback capacitor element (175) connected between the output node and the input node; and a current matching circuit (120) connected to the output node, and configured to sense an output voltage of the amplifier element and to provide a supplemental current ($I_M$) to the input node that is less than or equal to a feedback current ($I_F$) charging the feedback capacitor element. This supplemental current is substantially equal and opposite in polarity to a feedback current when the output voltage satisfies a set criterion.

20 Claims, 5 Drawing Sheets

SIGMA-DELTA MODULATOR

CROSS-REFERENCE TO RELATED APPLICATIONS

This application is a continuation of application Ser. No. 11/453,200 filed on Jun. 15, 2006, now issued as U.S. Pat. No. 7,315,268.

FIELD OF THE INVENTION

The present invention relates in general to current matching in an integrator circuit. In particular it relates to a system and method for keeping an integrator circuit from overloading.

BACKGROUND OF THE INVENTION

In many electronic devices, particularly those involved with the transmission and reception of wired or wireless transmissions, there is a need for devices to convert analog signals (e.g., those used to transmit data across a medium) into digital signals (e.g., those used inside the device to identify the data being sent). As a result, the analog-to-digital converter (ADC) is a common element in many electronic circuits.

One kind of circuit that may be used in an ADC is a sigma-delta modulator (SDM). An SDM is a circuit that generates a digital pulse based on an analog signal received at its input. Its output pulses are fixed in width with respect to the amplitude of the received analog waveform. As the amplitude of the input waveform rises, the SDM produces more pulses of a high value; as the amplitude of the input waveform falls, the SDM produces more pulses of a low value. If the amplitude of the input waveform remains neutral, the SDM produces roughly equal numbers of high and low values (i.e., the average should be approximately zero).

An SDM operates on two main principles: oversampling, and noise shaping. Through oversampling, the SDM samples an incoming signal at a sampling frequency that is greater than the signal bandwidth. This spreads the noise power over a bandwidth equal to the sampling frequency. Through noise shaping, the SDM operates as a lowpass filter on the incoming signal, and as a highpass filter on the associated noise. This "shapes" the noise so that most of the energy will be above the signal bandwidth. By employing a digital lowpass filtering stage, the noise can be attenuated out of the signal-plus-noise. And by employing decimation, the sampled signal can be brought to a Nyquist rate for final processing.

In its simplest form an SDM includes an integrator and a comparator with some feedback coming from the comparator to the integrator. The integrator accumulates an input signal over a set time period and the comparator compares that integrated result to a reference to determine whether a digital "1" or a digital "0" has been received during that time period (e.g., a clock cycle). For example, a positive reference voltage might represent a digital "1" value and a negative reference voltage might represent a digital "0" value. In such a circuit, the threshold for the comparator can be set around zero. In operation, if a positive input signal is received, the output of the integrator will tend to accumulate upwards, giving a positive voltage output value that the comparator will determine is a digital "1" value. Likewise, if a negative input signal is received, the output of the integrator will tend to accumulate downwards, giving a negative voltage output value that the comparator will determine is a digital "1" value.

SDMs of higher orders can be formed by adding in additional integrators. Each additional integrator will increase the order by one and will push more noise outside of the passband of the SDM, thus improving the signal-to-noise ratio, among other things.

However, because the SDM uses an integrator, it may overload or become unstable in some circumstances. For example, if the current or voltage input to the integrator is high enough for long enough, the output of the integrator might reach its saturation point. This is particularly true for SDM of higher orders (e.g., third order and higher).

One way to limit integrator saturation or overload is through the use of p-type and n-type diodes to clamp the integrator's output. In this way one diode is connected between the output of an integrator and a positive reference voltage and the other diode is connected between the output of an integrator and a negative reference voltage. The diodes conduct when the integrator output reaches the respective reference voltage, keeping the output of the integrator from passing it. But this may require true dual-isolated wells for both the p-type and n-type diodes, and not all devices have such wells. In addition it can be difficult to generate the required reference voltages.

Another way to limit integrator saturation or overload is to zero the integrator's input when there is a danger of overload or saturation. This can be done by disconnecting the integrator's input and reconnecting it when the danger of overload or saturation is passed. However, this can create transient voltages or currents when the integrator circuitry is disconnected and reconnected, which can be harmful to the circuit's performance.

Still another way to limit integrator saturation or overload is to use power and ground rails to provide natural minimum and maximum output values for the integrator. But with this solution an operational amplifier (op amp) in the integrator may saturate when its output is clamped, debiasing the transistors in the op amp. Rebiasing the op amp may take time, which may be undesirable if speed of operation is important.

In addition, such a solution can reduce linearity. In such circumstances, the bias current for each integrator must be much larger than the maximum output current (e.g., M times larger, where M is an integer greater than 1). In a higher order circuit, when the last integrator saturates, its feedforward element outputs its bias current. This means that the previous integrator's feedforward must output a normal operating current that is larger than the last integrator's feedforward bias current, and so forth down the line, each one being M times larger. In this way bias currents increase exponentially for successively preceding stages, i.e. every stage must have a bias at least M times larger than its subsequent stage. If multiple stages are used, the bias current requirement for the first stage can be extremely high, which can result in very high power consumption.

It is therefore desirable to provide another way of preventing or limiting the saturation or overload of an integrator used in an SDM.

BRIEF DESCRIPTION OF THE DRAWINGS

The accompanying figures where like reference numerals refer to identical or functionally similar elements and which together with the detailed description below are incorporated in and form part of the specification, serve to further illustrate an exemplary embodiment and to explain various principles and advantages in accordance with the present invention.

DETAILED DESCRIPTION

The instant disclosure is provided to further explain in an enabling fashion the best modes of performing one or more embodiments of the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms such as first and second, and the like, if any, are used solely to distinguish one from another entity, item, or action without necessarily requiring or implying any actual such relationship or order between such entities, items or actions. It is noted that some embodiments may include a plurality of processes or steps, which can be performed in any order, unless expressly and necessarily limited to a particular order; i.e., processes or steps that are not so limited may be performed in any order.

Much of the inventive functionality and many of the inventive principles when implemented, are best implemented in integrated circuits (ICs), and in particular through the use of circuits involving CMOS transistors. It is expected that one of ordinary skill, notwithstanding possibly significant effort and many design choices motivated by, for example, available time, current technology, and economic considerations, when guided by the concepts and principles disclosed herein will be readily capable of generating such ICs with minimal experimentation. Therefore, in the interest of brevity and minimization of any risk of obscuring the principles and concepts according to the present invention, further discussion of such ICs, if any, will be limited to the essentials with respect to the principles and concepts used by the exemplary embodiments.

Sigma-Delta Modulator

As noted above, a sigma-delta modulator (SDM) employs one or more integrators in conjunction with a comparator to help convert an analog input value into a digital output value. Because of the possibility of integrator overload or saturation, it is desirable to provide some mechanism for limiting the output of the integrators to prevent their saturation or overload.

One way to limit integrator saturation or overload is to actively match an integrating capacitor current in the integrator rather than just passively clamping the output of the integrator. Providing a matching current does not necessarily require true dual-isolated wells. It may also allow the bias currents for the cascading integrators in a higher order sigma-delta modulator to scale linearly with the number of integrators, rather than exponentially, which means the power consumption also scales linearly. And with current matching, the op amp in the integrator is never saturated, which may provide for a fast response for the integrator circuit.

Figure 1:
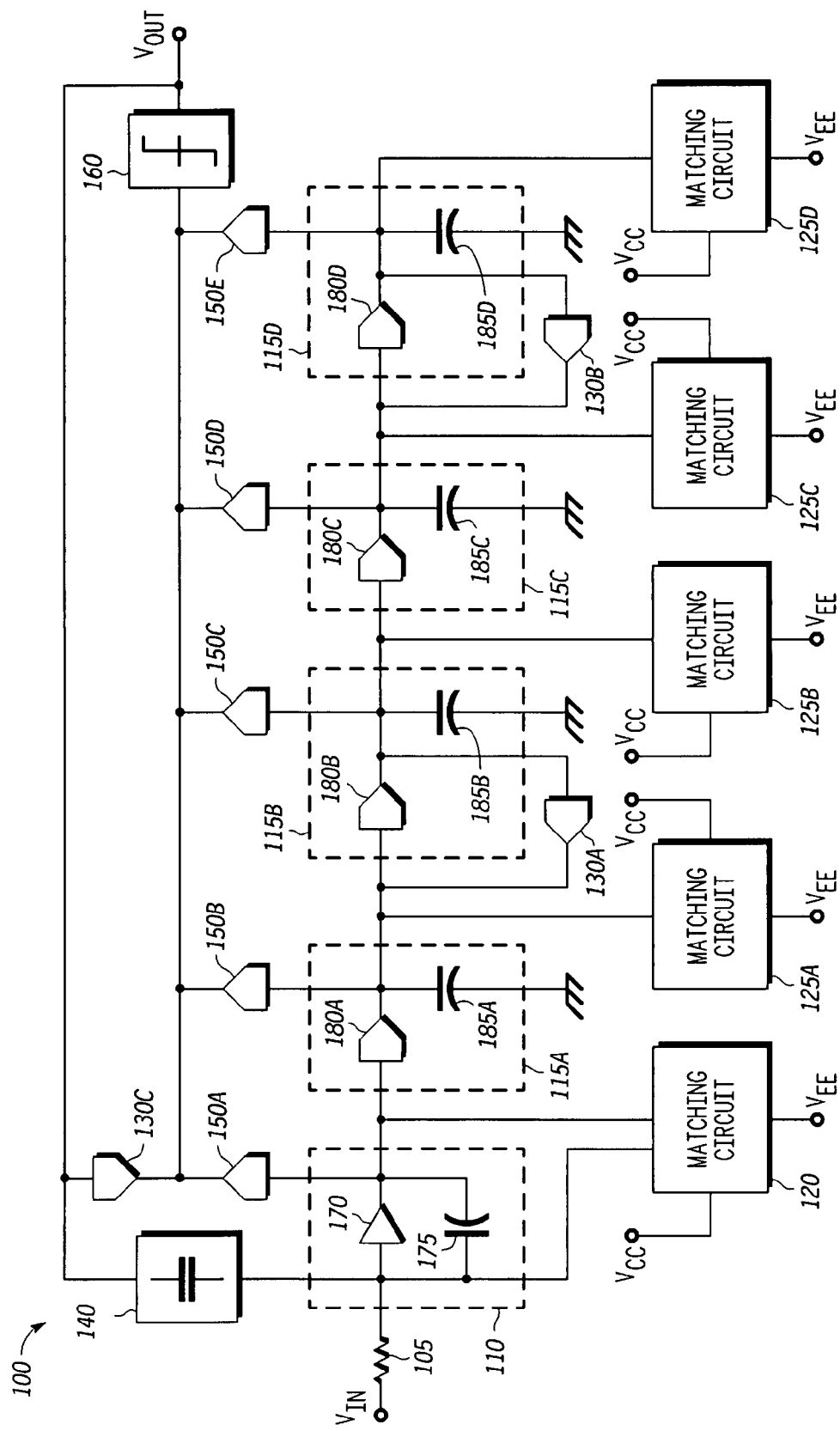
FIG. 1 is a circuit diagram of a sigma-delta modulator including a plurality of integrators according to a disclosed embodiment.

FIG. 1 is a circuit diagram of a sigma-delta modulator (SDM) including a plurality of integrators according to a disclosed embodiment. This circuit is a fifth order SDM, i.e., one with five cascaded integrators. As shown in FIG. 1, the SDM includes an input resistor 105, integrators 110, 115A, 115B, 115C, and 115D, matching circuits 120, 125A, 125B, 125C, and 125D, feedback transconductors 130A, 130B, and 130C, a feedback switch capacitor element 140, feedforward transconductors 150A, 150B, 150C, 150D, and 150E, and a comparator 160.

The input resistor 105 is connected between an input node and the first integrator 110 and is used to convert the input voltage into an input current. The value of the input resistor can be chosen to set the desired size of the input current.

The integrator 110 is a closed-loop integrator including an amplifier 170 and a feedback capacitor 175. The amplifier 170 is connected at its input to the input resistor 105. The feedback capacitor 175 is connected between the output node and the input node of the amplifier 170. The feedback capacitor 175 can be a dielectric capacitor, a capacitor-resistor circuit, a switch capacitor, or the like. In operation the integrator 110 serves to integrate the signal received at the input.

Although shown as a single-input amplifier, the first amplifier could be an operational amplifier with one input connected to a reference voltage.

Integrators 115A to 115D are each open-loop integrators each including a respective one of the transconductors 180A, 180B, 180C, and 180D and the integrating capacitors 185A, 185B, 185C, and 185D. For ease of description, however, the integrators 115A to 115D will be referred to by example as an open-loop integrator 115, the transconductors 180A to 180D will be referred to by example as an transconductor 180, and the integrating capacitors 185A to 185D will be referred to by example as an integrating capacitor 185.

The input of each transconductor 180 is connected to the output of the previous integrator 115. Each integrating capacitor 185 is connected between the out put of its corresponding transconductor 180 and ground. Each integrating capacitor 185 can be a dielectric capacitor, a capacitor-resistor circuit, a switch capacitor, or the like. In operation each open-loop integrator 115 serves to integrate the signal received at its input.

The matching circuit 120 is a closed-loop matching circuit that is designed to sense the output of the integrator 110 and provide a matching current to the feedback capacitor 175 to effectively limit the output swing of the first integrator 110.

The matching circuits 125A to 125D are open-loop matching circuits that are designed to sense the output of the corresponding open-loop integrators 115 and provide a matching current to corresponding integrating capacitor 185 to effectively limit the output swing of the open-loop integrator 115. The matching circuits 125A to 125D will be referred to by example as an open-loop matching circuit 125

The feedback transconductor 130A is a transconductor connected between the output node and the input node of the integrator 115B, while the feedback transconductor 130B is a transconductor connected between the output node and the input node of the integrator 115D. Each of the feedback transconductors 130A and 130B is arranged to provide a feedback signal for its respective integrator. This allows the circuit to act as a resonator, and thereby lower energies wherever the resonant frequencies are. These resonant frequencies can then be distributed throughout a band of interest.

The feedback transconductor 130C is a transconductor connected between the output node and the input node of the comparator 160, and is arranged to provide a feedback signal for the comparator 160.

The feedback switch capacitor element 140 is provided between the output node of the comparator 160 and the input node of the integrator 110, and serves to provide a feedback signal to the integrator 110.

The feedforward transconductors 150A to 150E take the outputs from the integrators 110 and 115A to 115D and provide them to the comparator 160. These transconductors 150A to 150E have their transconductances (along with the capacitances of the feedback capacitor 175 and the integrating capacitor 185) set to optimize the performance of the SDM 100 (e.g., to properly distribute the SDM's resonant frequencies).

The comparator 160 takes the outputs of the feedforward transconductors 150A to 150E adds them together and compares the result to a set threshold to determine whether a digital "1" value or a digital "0" value was received at the input node of the SDM 100 for the given time period. The comparator outputs a digital output voltage $V_{OUT}$ that only changes once per time period.

By employing the matching circuits 120 and 125, the SDM 100 naturally recovers from overloading. And since in higher-order modulators overloading is synonymous with instability, this means that the SDM 100 may be more stable compared to SDMs without the matching circuits 120 and 125.

In an embodiment shown, the SDM 100 transforms an analog input signal into a digital 1-bit output signal. However, in doing so no circuit need be debiased, and no custom voltage references capable of driving low impedance are required. It can be implemented using comparatively low power since there is no need for exponentially increasing bias current as the order of the SDM increases, and at a comparatively low complexity since it is independent of circuitry which produces its nominal input.

Although the SDM 100 in FIG. 1 is shown as a fifth order SDM, it should not be limited to such an implementation. The disclosed current matching circuits and methods can apply to SDMs with more or fewer stages. And the use of open-loop and closed-loop integrators can be varied as required by the needs of any given circuit design.

In addition, although this embodiment is shown with respect to an SDM 100, it could be equally applicable to other devices that employ integrators, e.g., filters.

A sigma-delta modulator is provided in one embodiment, including a first integrator for receiving an input voltage and providing a first integrating output voltage; a first feedforward element for converting the first integrating output voltage to a first feedforward signal; a comparator for comparing the first feedforward signal to a comparator threshold value to produce a comparator output value; a first feedback element for providing the comparator output value to the first integrator; and a first matching circuit for providing a first matching current to an output node of the first integrator when the first output voltage rises above a first voltage maximum value or falls below a first voltage minimum value.

In one embodiment the first integrator is a closed-loop integrator and in another embodiment the first integrator an open-loop integrator.

In one embodiment the sigma-delta modulator can further include a second integrator for receiving the first integrating output voltage and providing a second integrating output voltage; a second feedforward element for converting the first integrating output voltage to a first feedforward signal; and a second matching circuit for providing a second matching current to the output node of the second integrator when the second output voltage rises above a second voltage maximum value or falls below a second voltage minimum value. In this embodiment the comparator compares a sum of the first and second feedforward signals to the comparator threshold value to produce the comparator output value.

In one embodiment the second integrator is a closed-loop integrator and in another embodiment the second integrator an open-loop integrator.

In one embodiment, an integrator circuit can be provided, including an amplifier element configured to receive an input signal at an input node, amplify the input signal, and provide an amplified input signal at an output node; a feedback capacitor element connected between the output node and the input node; and a current matching circuit connected to the output node, and configured to sense an output voltage of the amplifier element and to provide a supplemental current to the input node that is less than or equal to a feedback current charging the feedback capacitor element.

In one embodiment, the supplemental current can be substantially equal and opposite in polarity to a feedback current when the output voltage satisfies a set criterion. The set criterion can include one of: having the output voltage rise above a set positive threshold value, and having the output voltage fall below a set negative threshold value.

In one embodiment, an integrator circuit can also be provided, including a transconductor configured to receive an input voltage and to provide an output current at an output node; an integrating capacitor element connected between the output node and a reference voltage, the integrating capacitor element being charged by the output current; and a current matching circuit connected to the output node, configured to sense an output voltage at the output node and to provide a supplemental current to the output node that is less than or equal to an integrating current charging the integrating capacitor element.

In one embodiment, the supplemental current can be substantially equal and opposite in polarity to an integrating current when the output voltage satisfies a set criterion. The set criterion can include one of: having the output voltage rise above a set positive threshold value, and having the output voltage fall below a set negative threshold value.

Swing Control Circuits

Figure 2:
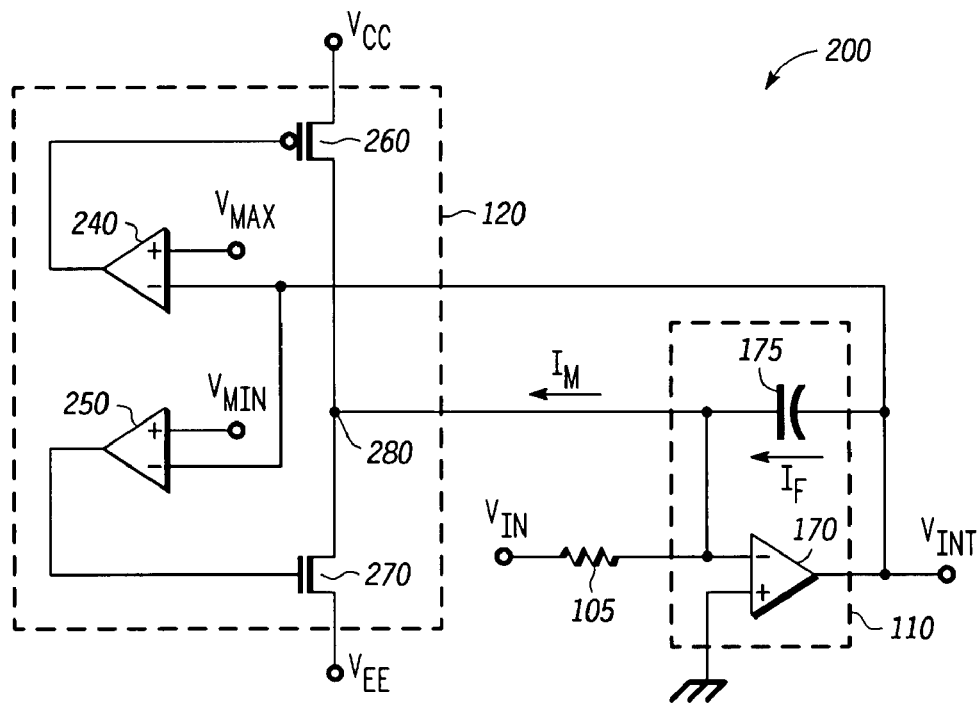
FIG. 2 is a block diagram of a closed-loop swing control circuit according to a disclosed embodiment.

FIG. 2 is a block diagram of a closed-loop swing control circuit 200 according to a disclosed embodiment. As shown in FIG. 2, the closed-loop swing control circuit 200 is formed from the input resistor 105, the integrator 110 (i.e., the closed-loop integrator), and the matching circuit 120 from FIG. 1. The matching circuit 120 includes matching circuit amplifiers 240 and 250, and matching circuit transistors 260 and 270. The resistor 105 receives the input voltage $V_{IN}$; the integrator 110 generates an output current that is used as a feedback current $I_F$ as well as an intermediate voltage $V_{INT}$ as an output voltage; and the first matching circuit 115 generates a matching current $I_M$.

The matching circuit amplifier 240 accepts a maximum integrator voltage $V_{MAX}$ at its positive input and the output of the integrator 110 at its negative input. It compares the two and outputs a positive voltage (i.e., a high value) when the output of the integrator 110 is below the maximum integrator voltage $V_{MAX}$ and a negative voltage (i.e., a low value) when the output of the integrator 110 is above the maximum integrator voltage $V_{MAX}$.

The matching circuit amplifier 250 accepts a minimum integrator voltage $V_{MIN}$ at its positive input and the output of the integrator 110 at its negative input. It compares the two and outputs a negative voltage (i.e., a low value) when the output of the integrator 110 is above the minimum integrator voltage $V_{MIN}$ and a positive voltage (i.e., a high value) when the output of the integrator 110 is below the minimum integrator voltage $V_{MIN}$.

The matching circuit transistor 260 is connected between a positive supply voltage $V_{CC}$ and the input of the integrator 110, and has its gate connected to the output of the matching circuit amplifier 240. The matching circuit transistor 270 is connected between a negative supply voltage $V_{EE}$ and the input of the integrator 110, and has its gate connected to the output of the matching circuit amplifier 250.

In this embodiment the matching circuit transistor 260 is a p-type transistor (e.g., PMOS) that is conductive when its gate has is supplied with a low value and is non-conductive when its gate is supplied with a high value, and the matching circuit transistor 270 is an n-type transistor (e.g., NMOS) that is conductive when its gate has is supplied with a high value and is non-conductive when its gate is supplied with a low value.

The matching circuit 120 will operate as follows. When the output of the integrator 110 is between the minimum voltage $V_{MIN}$ and the maximum voltage $V_{MAX}$, the output of the matching circuit amplifier 240 will be high and the output of the second matching circuit amplifier 250 will be low. This will render the matching circuit transistors 260 and 270 both non-conductive. The integrator 110 will function normally without any matching current being provided.

When the output of the integrator 110 is above the maximum voltage $V_{MAX}$, the output of the matching circuit amplifiers 240 and 250 will be low. This will render the matching circuit transistor 260 to be conductive and the matching circuit transistor 270 to be non-conductive. The input of the integrator 110 will be provided with a positive matching current from the positive supply voltage $V_{CC}$ that will counter the changing voltage at the output of the integrator 110, thus serving to reduce the feedback current, thereby ultimately reducing the output of the integrator 110.

When the output of the integrator 110 is below the minimum voltage $V_{MIN}$, the output of both the matching circuit amplifiers 240 and 250 will be high. This will render the matching circuit transistor 260 non-conductive and the matching circuit transistor 270 conductive. The input of the integrator 110 will be connected to the negative supply voltage $V_{EE}$, which will counter the changing voltage at the output of the integrator 110, thus serving to increase the feedback current, thereby ultimately increasing the output of the integrator 110.

In either of these previous cases, once the output of the integrator 110 returns to a value between the minimum voltage $V_{MIN}$ and the maximum voltage $V_{MAX}$, the output of the matching circuit amplifier 240 will be high and the output of the matching circuit amplifier 250 will be low. This will again render both the matching circuit transistors 260 and 270 non-conductive and allow the integrator 110 to function normally without any matching current being provided.

In this embodiment the matching circuit amplifiers 240 and 250 are operational amplifiers.

Although in FIG. 2 the matching circuit transistor 260 is a PMOS transistor and the matching circuit transistor 270 is an NMOS transistor, this could be changed in alternate embodiments. The particular arrangement of the inputs of the matching circuit amplifiers 240 and 250 and the types of the matching circuit transistors 260 and 270 can be changed so long as their operation remains substantially as described above. In addition, although the matching circuit transistor 270 is shown as being connected to the negative supply voltage $V_{EE}$, it could be connected to a ground voltage or a low supply voltage $V_{SS}$ (lower than the positive supply voltage $V_{CC}$) in alternate embodiments.

Figure 3:
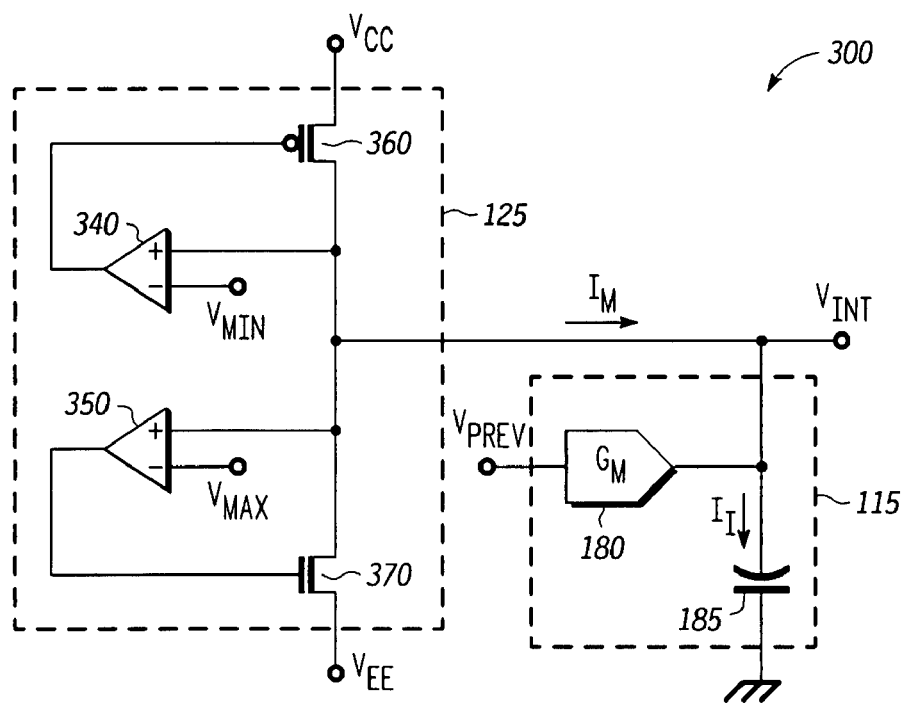
FIG. 3 is a block diagram of an open-loop swing control circuit according to a disclosed embodiment.

FIG. 3 is a block diagram of an open-loop swing control circuit 300 according to a disclosed embodiment. As shown in FIG. 3, the open-loop swing control circuit 300 is formed from an open-loop integrator 115 (i.e., one of the integrators 115A to 115D) and a corresponding open-loop matching circuit 125 (i.e., one of the matching circuits 125A to 125D) from FIG. 1. The open-loop matching circuit 125 includes matching circuit amplifiers 340 and 350, and matching circuit transistors 360 and 370. Each open-loop integrator 115 receives a previous voltage $I_{PREV}$ as an input voltage, generates an integrating current $I_I$ as well as an intermediate voltage $V_{INT}$ as an output voltage. Each matching circuit 125 in turn generates a matching current $I_M$.

The matching circuit amplifier 340 accepts a minimum integrator voltage $V_{MIN}$ at its negative input and the output of a respective open-loop integrator 115 at its positive input. It compares the two and outputs a positive voltage (i.e., a high value) when the output of the open-loop integrator 115 is above the minimum integrator voltage $V_{MIN}$, and outputs a negative voltage (i.e., a low value) when the output of the open-loop integrator 115 is below the minimum integrator voltage $V_{MIN}$.

The matching circuit amplifier 350 accepts a maximum integrator voltage $V_{MAX}$ at its negative input and the output of a respective open-loop integrator 115 at its positive input. It compares the two and outputs a negative voltage (i.e., a low value) when the output of the open-loop integrator 115 is below the maximum integrator voltage $V_{MAX}$ and a positive voltage (i.e., a high value) when the output of the open-loop integrator 115 is above the maximum integrator voltage $V_{MAX}$.

The matching circuit transistor 360 is connected between a positive supply voltage $V_{CC}$ and the output of the respective open-loop integrator 115, and has its gate connected to the output of the matching circuit amplifier 340. The matching circuit transistor 370 is connected between a negative supply voltage $V_{EE}$ and the output of the respective open-loop integrator 115, and has its gate connected to the output of the matching circuit amplifier 350.

In this embodiment the matching circuit transistor 360 is a p-type transistor (e.g., PMOS) that is conductive when its gate has is supplied with a low value and is non-conductive when its gate is supplied with a high value, and the matching circuit transistor 370 is an n-type transistor (e.g., NMOS) that is conductive when its gate has is supplied with a high value and is non-conductive when its gate is supplied with a low value.

The open-loop matching circuit 125 will operate as follows. When the output of a respective open-loop integrator 115 is between the minimum voltage $V_{MIN}$ and the maximum voltage $V_{MAX}$, the output of the matching circuit amplifier 340 will be high and the output of the matching circuit amplifier 350 will be low. This will render the matching circuit transistors 360 and 370 both non-conductive. The open-loop integrator 115 will function normally without any matching current being provided.

When the output of the open-loop integrator 115 is above the maximum voltage $V_{MAX}$, the output of the matching circuit amplifiers 340 and 350 will both be high. This will render the matching circuit transistor 360 to be non-conductive and the matching circuit transistor 370 to be conductive. The output of the open-loop integrator 115 will be provided with a current from the negative supply voltage $V_{EE}$ that will counter the increasing voltage at the output of the open-loop integrator 115, thus serving to reduce the output current of the open-loop integrator 115.

When the output of the open-loop integrator 115 is below the minimum voltage $V_{MIN}$, the output of both the matching circuit amplifiers 340 and 350 will be low. This will render the matching circuit transistor 360 conductive and the matching circuit transistor 370 non-conductive. The output of the open-loop integrator 115 will be connected to the positive supply voltage $V_{CC}$, which will counter the decreasing voltage at the output of the open-loop integrator 115, thus serving to increase the output current of the open-loop integrator 115.

In either of these previous cases, once the output of the open-loop integrator 115 returns to a value between the minimum voltage $V_{MIN}$ and the maximum voltage $V_{MAX}$, the output of the matching circuit amplifier 340 will be high and the output of the matching circuit amplifier 350 will be low. This will again render both the matching circuit transistors 360 and 370 non-conductive and allow the open-loop integrator 115 to function normally without any matching current being provided.

Although in FIG. 3 the matching circuit transistor 360 is a PMOS transistor and the matching circuit transistor 370 is an NMOS transistor, this could be changed in alternate embodiments. The particular arrangement of the inputs of the matching circuit amplifiers 340 and 350 and the types of the matching circuit transistors 360 and 370 can be changed so long as their operation remains substantially as described above. In addition, although the matching circuit transistor 370 is shown as being connected to the negative supply voltage $V_{EE}$, it could be connected to ground or a lower positive supply voltage $V_{SS}$ (lower than the positive supply voltage $V_{CC}$) in alternate embodiments.

In addition, alternate embodiments could use multiple transistors in place of either or both of the matching circuit transistors 360 and 370, with the multiple transistors being arranged as a cascade circuit.

Each matching circuit 120, 125 can use the same or different values for $V_{MIN}$ and $V_{MAX}$ to obtain a desired level of current control.

For a closed-loop case, in one embodiment, a current matching circuit can include a first operational amplifier configured to receive the amplifier output signal and a first reference voltage and to provide a first control signal; a second operational amplifier configured to receive the amplifier output signal and a second reference voltage and to provide a second control signal; a first transistor connected between a third reference voltage and the input node, the first control signal controlling a conductance of the first transistor; and a second transistor connected between a fourth reference voltage and the input node, the second control signal controlling a conductance of the second transistor. In this case the first and second operational amplifiers and the first and second transistors can be connected such that the first and second transistors will not both be conductive at the same time.

In one embodiment the third reference voltage is a greater than or equal to the first reference voltage, the first reference voltage is greater than the second reference voltage, and the second reference voltage is greater than or equal to the fourth reference voltage.

For an open-loop case, in one embodiment, a current matching circuit can include a first operational amplifier configured to receive the amplifier output signal and a first reference voltage and to provide a first control signal; a second operational amplifier configured to receive the amplifier output signal and a second reference voltage and to provide a second control signal; a first transistor connected between a third reference voltage and the output node, the first control signal controlling a conductance of the first transistor; and a second transistor connected between a fourth reference voltage and the output node, the second control signal controlling a conductance of the second transistor. In this case the first and second operational amplifiers and the first and second transistors can be connected such that the first and second transistors will not both be conductive at the same time.

In one embodiment the third reference voltage is a greater than or equal to the second reference voltage, the second reference voltage is greater than the first reference voltage, and the first reference voltage is greater than or equal to the fourth reference voltage.

In various embodiments the first and second transistors can be CMOS transistors of different type from each other.

Operation of the Swing Control Circuits

Figure 4:
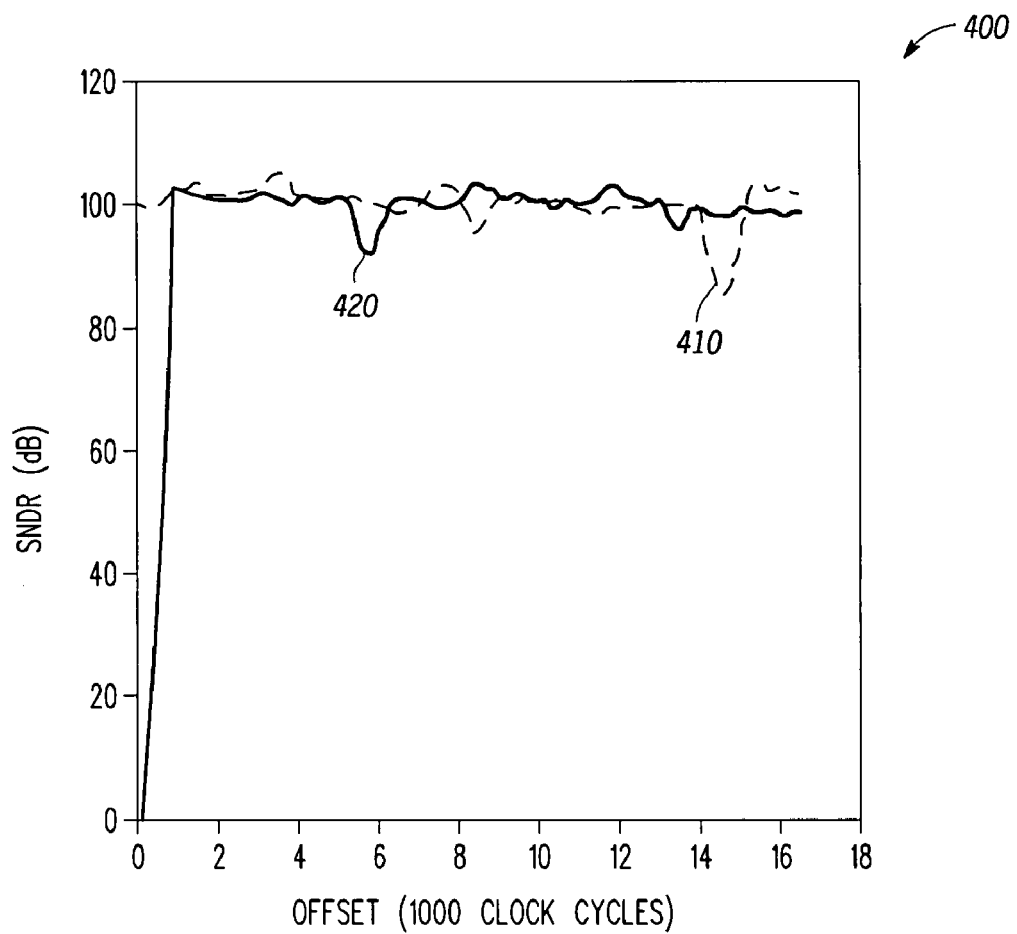
FIG. 4 is a graph of a simulation of performance recovery for the sigma-delta modulator of FIG. 1 according to a disclosed embodiment.

FIG. 4 is a graph of a simulation of performance recovery for the sigma-delta modulator (SDM) of FIG. 1 according to a disclosed embodiment. In particular, FIG. 4 shows a situation with no overload 410 and a situation with overload in the first 1024 clock cycles.

In particular, FIG. 4 shows the signal-to-noise-plus-distortion ratio (SNDR) versus the offset in clock cycles. The signal-to-noise ratio (SNR) of an incoming signal generally indicates the ratio of the received signal power of the incoming signal to the noise power of the incoming signal. It is useful as an indicator of the reliability of the incoming signal. The SNDR for an incoming signal is similar, but indicates the ratio of the signal power of the incoming signal to the received noise-plus-distortion power of the incoming signal. This can be a more useful indicator of the reliability of the incoming signal in cases where distortion is common, such as in modulated audio signals in which distortion can result from a carrier radio frequency.

FIG. 4 illustrates a full recovery in the performance of the SDM 100 following a 1024 clock cycle overload using 78× over-sampling ratio (OSR). In particular, once the offset gets above about 1000 clock cycles, the SNDR for the situation with overload and without are roughly the same.

Figure 5:
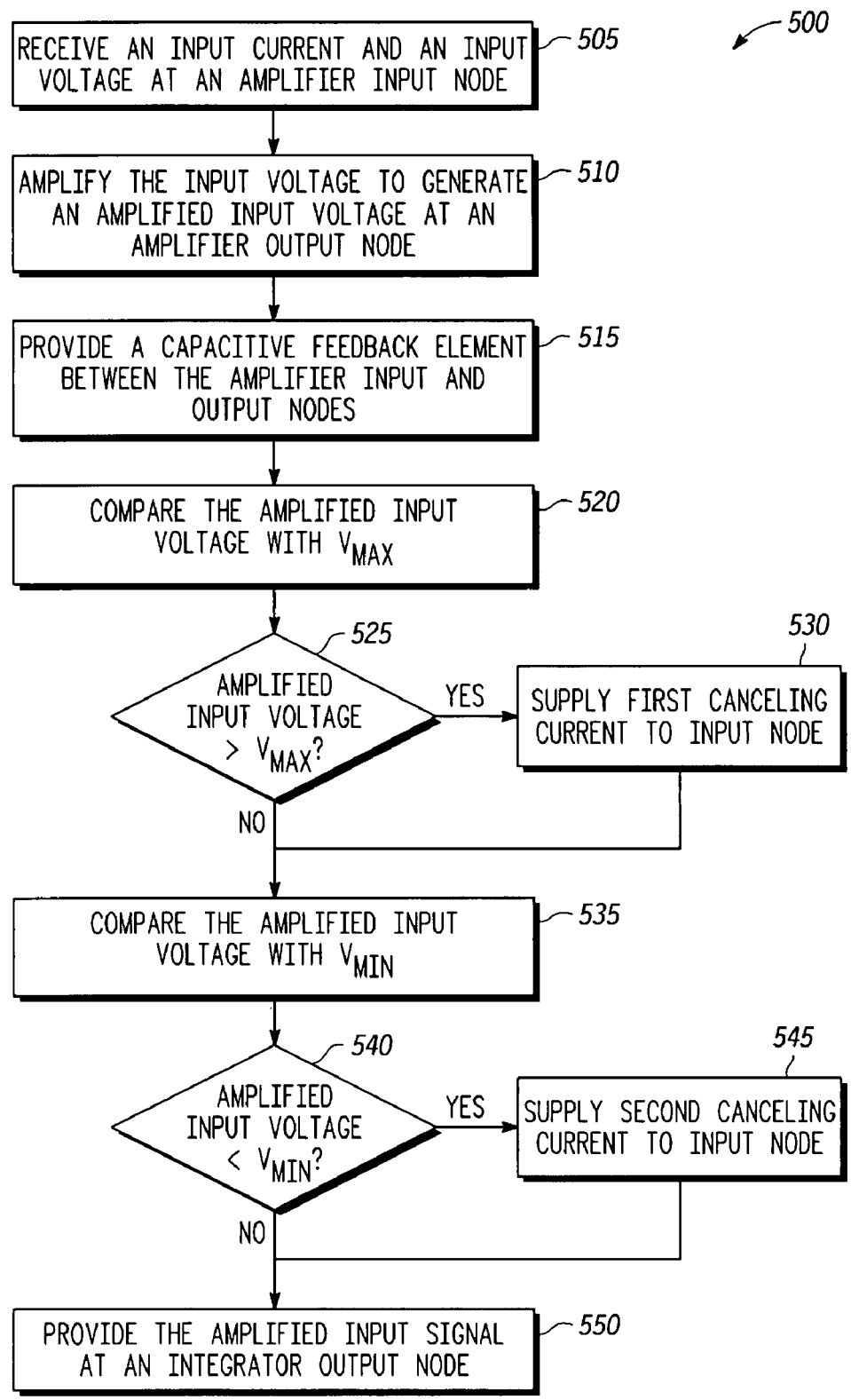
FIG. 5 is a flow chart of a general method of providing a matching current in a closed-loop matching circuit according to a disclosed embodiment.

Although FIG. 2 shows one particular embodiment of a closed-loop swing control circuit, the current invention should not be limited to that particular embodiment. FIG. 5 is a flow chart of a general method of providing a matching current in a closed-loop matching circuit according to a disclosed embodiment.

As shown in FIG. 5, the method 500 begins when an integrator 110 receives an input current and an input voltage at an amplifier input node (505) and proceeds to amplify the input voltage to generate an amplified input voltage at an amplifier output node (510).

The integrator 110 provides some sort of capacitive feedback between the amplifier input and output nodes (515).

A current matching element compares the amplified input voltage with a maximum output voltage $V_{MAX}$ (520) to determine if the amplified input voltage is greater than the maximum output voltage $V_{MAX}$ (525).

If the amplified input voltage is greater than the maximum output voltage $V_{MAX}$, then the current matching element connects the amplifier input node to a positive reference voltage $V_{CC}$ (530). This has the effect of countering the increasing feedback through a capacitive feedback element through the use of a canceling current, thus reducing the input voltage and preventing the amplifier element from overloading.

The current matching element also compares the amplified input voltage with a minimum output voltage $V_{MIN}$ (535) to determine if the amplified input voltage is lower than the minimum output voltage $V_{MIN}$ (540).

If the amplified input voltage is lower than the minimum output voltage $V_{MIN}$, then the current matching element connects the amplifier input node to a ground voltage (545). This has the effect of countering the decreased feedback through a capacitive feedback element through the use of a canceling current, thus increasing the input voltage and preventing the amplifier element from overloading.

Although FIG. 5 shows the comparison with $V_{MAX}$ taking place before the comparison with $V_{MIN}$, the order is not important. They could be performed in either order or at the same time.

If the comparisons of the amplified output voltage (520, 525, 535, 540) show that the amplified input voltage is between the minimum output voltage $V_{MIN}$ and the maximum output voltage $V_{MAX}$, no additional connections need be made to the amplifier input node.

In addition, the amplified input signal is also provided at the output node for a later circuit element to use (550). This can be done after the comparisons or in real time with the comparisons.

Figure 6:
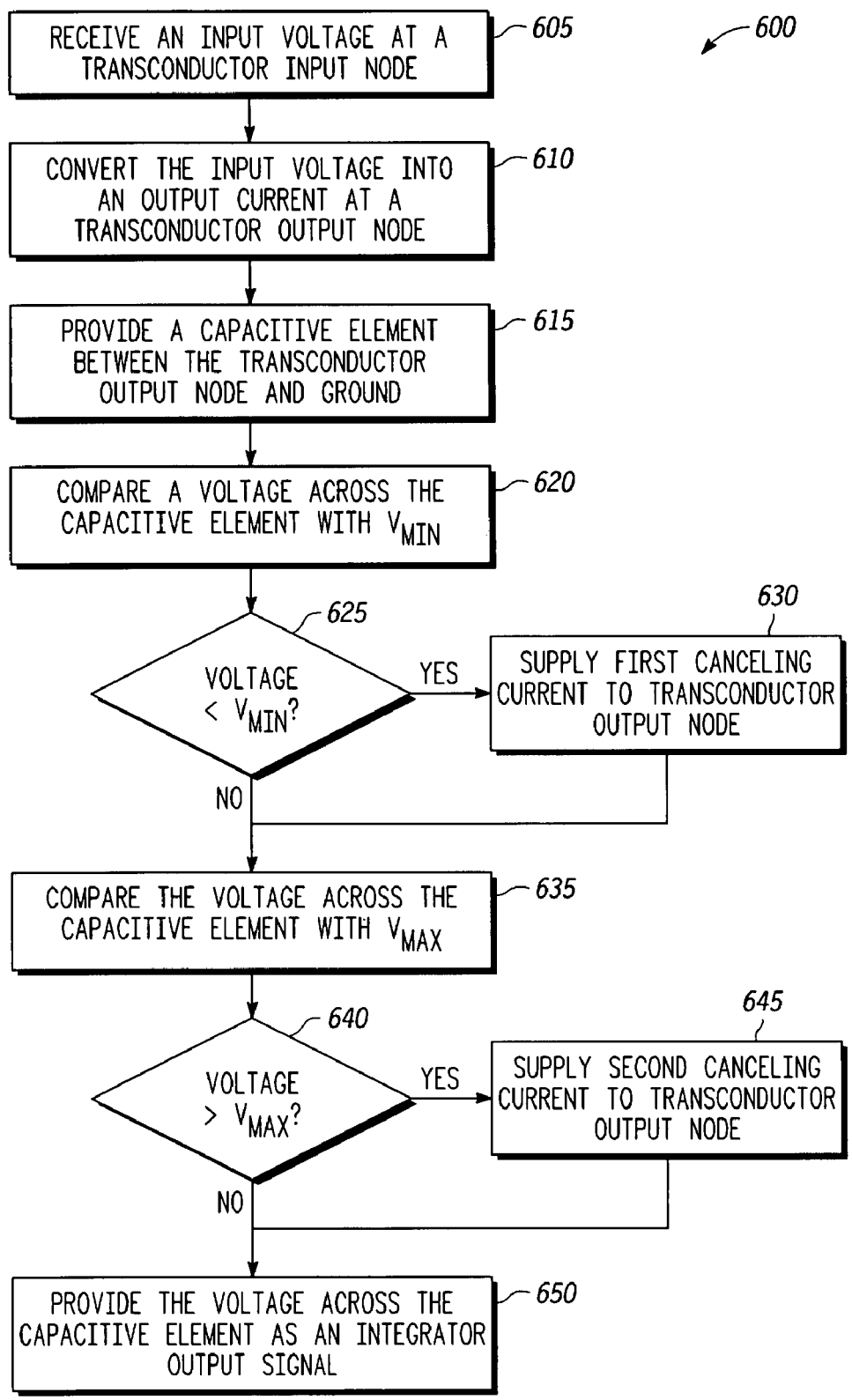
FIG. 6 is a flow chart of the operation of the closed-loop swing control circuit of FIG. 2 according to a disclosed embodiment.

Although FIG. 3 shows one particular embodiment of an open-loop swing control circuit, the current invention should not be limited to that particular embodiment. FIG. 6 is a flow chart of a general method of providing a matching current in an open-loop matching circuit according to a disclosed embodiment.

As shown in FIG. 6, the method 600 begins when an integrator receives an input voltage at a transconductor input node (605) and proceeds to convert the input voltage to an output current at a transconductor output node (610).

The integrator provides some sort of capacitive element between the transconductor output node and an integrating reference voltage (615). In one embodiment the integrating reference voltage is a ground voltage, though this can vary in alternate embodiments (e.g., a negative reference voltage, a positive reference voltage, or a differential voltage).

A current matching element then compares a voltage across the capacitive element with a minimum output voltage $V_{MIN}$ (620) to determine if the voltage across the capacitive element is lower than the minimum output voltage $V_{MIN}$ (625).

If the voltage across the capacitive element is lower than the minimum output voltage $V_{MIN}$, then the current matching element connects the amplifier output node to a first reference voltage (e.g., a positive power supply $V_{CC}$) (630). This has the effect of countering the decreasing the charge at the capacitive element by providing a first canceling current (i.e., a positive matching current), and preventing the amplifier element from overloading.

The current matching element also compares the voltage across the capacitive element with a maximum output voltage $V_{MAX}$ (635) to determine if the voltage across the capacitive element is greater than the maximum output voltage $V_{MAX}$ (640).

If the voltage across the capacitive element is greater than the maximum output voltage $V_{MAX}$, then the current matching element connects the amplifier output node to a second reference voltage (645). This has the effect of providing a second canceling current (i.e., a negative matching current) countering the increasing charge at the capacitive element, thus preventing the amplifier element from overloading.

Although FIG. 6 shows the comparison with $V_{MIN}$ taking place before the comparison with $V_{MAX}$, the order is not important. They could be performed in either order or at the same time.

If the comparisons of the amplified output voltage (620, 625, 635, 640) show that the voltage across the capacitive element is between the minimum output voltage $V_{MIN}$ and the maximum output voltage $V_{MAX}$, no additional connections need be made to the amplifier output node.

In addition, the amplified input signal is also provided at the output node for a later circuit element to use (650). This can be done after the comparisons or in real time with the comparisons.

In one embodiment a method of current matching is provided that includes receiving an input signal at an input node of a signal processing element; performing a signal processing operation on the input signal to provide an output signal at an output node of the signal processing element; providing a capacitive element between the output node and a reference node; comparing a voltage across the capacitive element with a first reference voltage; comparing the voltage across the capacitive element with a second reference voltage; connecting the output node to a third reference voltage when the voltage across the capacitive element is below the first reference voltage; and connecting the output node to a fourth reference voltage when the voltage across the capacitive element is above the second reference voltage.

In one embodiment, the input signal is an input voltage and the output signal is an output current, the signal processing operation is a conversion of the input voltage to the output current, and the reference node is a fifth reference voltage. In this embodiment, the fifth reference voltage may be one of a ground voltage and a negative power supply voltage. In another embodiment, the input signal is an input voltage and the output signal is an output voltage, the signal processing operation is a voltage amplification process amplifying the input voltage to the output voltage, and the reference node is the input node.

In one embodiment, the third reference voltage is a positive supply voltage, and the fourth reference voltage is one of a ground voltage and a negative power supply voltage. In another embodiment, the third reference voltage is one of a ground voltage and a negative power supply voltage, and the fourth reference voltage is a positive supply voltage.

In one embodiment, the third reference voltage is greater than or equal to the second reference voltage, the second reference voltage is greater than the first reference voltage, and the first reference voltage is greater than or equal to the fourth reference voltage. In another embodiment, the fourth reference voltage is greater than or equal to the second reference voltage, the second reference voltage is greater than the first reference voltage, and the first reference voltage is greater than or equal to the third reference voltage.

The method may be implemented in an integrated circuit.

Although in the above description, the matching circuits 110, 115 compare a voltage (the feedback voltage $I_F$ or the integrating voltage $I_I$) to a pair of reference voltages, the matching process is actually current driven. If an output current of the various amplifiers remains at a particular value (high or low) for too long, it can increase the charge (i.e., the voltage) on the integrating or feedback capacitor 175, 185 to an undesirable degree.

And while it is this output voltage that the matching circuit 110, 115 actually uses to determine how it should operate, it is the output current that it seeks to compensate for. In particular, the matching circuit 110, 115 seeks to provide a matching current $I_M$ that will effectively cancel out any integrating current $I_I$ and prevent the charge on the integrating or feedback capacitor 175, 185 from increasing to an undesirable degree.

CONCLUSION

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled. The various circuits described above can be implemented in discrete circuits or integrated circuits, as desired by implementation.

What is claimed is:

1. A sigma-delta modulator, comprising:
    a first integrator for receiving an input voltage and providing a first integrating output voltage;
    a first feedforward element for converting the first integrating output voltage to a first feedforward signal;
    a comparator for comparing the first feedforward signal to a comparator threshold value to produce a comparator output value;
    a first feedback element for providing the comparator output value to the first integrator; and
    a first matching circuit for providing a first matching current to an output node of the first integrator when the first output voltage rises above a first voltage maximum value or falls below a first voltage minimum value.

2. The sigma-delta modulator of claim 1, wherein the first integrator is one of a closed-loop integrator and an open-loop integrator.

3. The sigma-delta modulator of claim 1, further comprising:
    a second integrator for receiving the first integrating output voltage and providing a second integrating output voltage;
    a second feedforward element for converting the first integrating output voltage to a first feedforward signal; and
    a second matching circuit for providing a second matching current to the output node of the second integrator when the second output voltage rises above a second voltage maximum value or falls below a second voltage minimum value, wherein
    the comparator compares a sum of the first and second feedforward signals to the comparator threshold value to produce the comparator output value.

4. The sigma-delta modulator of claim 3, wherein the second integrator is one of a closed-loop integrator and an open-loop integrator.

5. The sigma-delta modulator of claim 3, wherein the second integrator comprises:
    a second transconductor configured to receive the first integrating output voltage and to provide a second integrating output current and the second integrating output voltage at a second output node;
    a second integrating capacitor element connected between the second output node and a main reference voltage, the second integrating capacitor element being charged by the second integrating output current; and
    a second current matching circuit connected to the second output node, configured to sense the second integrating output voltage at the second output node and to provide a second supplemental current to the second output node that is less than or equal to the second integrating output current charging the second integrating capacitor element.

6. The sigma-delta modulator of claim 5, wherein the second supplemental current is substantially equal and opposite in polarity to the second integrating current when the second output voltage satisfies a set second criterion.

7. The sigma-delta modulator of claim 6, wherein the set second criterion includes one of: having the second output voltage rise above a set second positive threshold value, and having the second output voltage fall below a set second negative threshold value.

8. The sigma-delta modulator of claim 5, wherein the second current matching circuit further comprises:
    a primary operational amplifier configured to receive the second integrating output voltage and a first reference voltage and to provide a primary control signal;
    a secondary operational amplifier configured to receive the second integrating output voltage and a second reference voltage and to provide a secondary control signal;
    a primary transistor connected between a third reference voltage and the second output node, the primary control signal controlling a conductance of the primary transistor; and
    a secondary transistor connected between a fourth reference voltage and the second output node, the secondary control signal controlling a conductance of the secondary transistor,
    wherein the primary and secondary operational amplifiers and the primary and secondary transistors are connected such that the primary and secondary transistors will not both be conductive at the same time.

9. The sigma-delta modulator of claim 8,
    wherein the third reference voltage is a greater than or equal to the second reference voltage,
    wherein the second reference voltage is greater than the first reference voltage, and
    wherein the first reference voltage is greater than or equal to the fourth reference voltage.

10. The sigma-delta modulator of claim 8, wherein the first and second transistors are CMOS transistors of different type from each other.

11. The sigma-delta modulator of claim 1, wherein the first integrator comprises:
    a first amplifier element configured to receive the input voltage at a first input node, amplify the input voltage, and provide the first integrating output voltage at a first output node;
    a first feedback capacitor element connected between the first output node and the first input node; and
    a first current matching circuit connected to the first output node, and configured to sense the first integrating output voltage and to provide a first supplemental current to the first input node that is less than or equal to a first feedback current charging the first feedback capacitor element.

12. The sigma-delta modulator of claim 11, wherein the supplemental current is substantially equal and opposite in polarity to the first feedback current when the first integrating output voltage satisfies a set criterion.

13. The sigma-delta modulator of claim 12, wherein the set criterion includes one of: having the first integrating output voltage rise above a set first positive threshold value, and having the first integrating output voltage fall below a set first negative threshold value.

14. The sigma-delta modulator of claim 11, wherein the first current matching circuit further comprises:
- a primary operational amplifier configured to receive the first integrating output voltage and a first reference voltage and to provide a primary control signal;
- a secondary operational amplifier configured to receive the first integrating output voltage and a second reference voltage and to provide a secondary control signal;
- a primary transistor connected between a third reference voltage and the first input node, the primary control signal controlling a conductance of the primary transistor; and
- a secondary transistor connected between a fourth reference voltage and the first input node, the secondary control signal controlling a conductance of the secondary transistor,
- wherein the primary and secondary operational amplifiers and the primary and secondary transistors are connected such that the primary and secondary transistors will not both be conductive at the same time.

15. The sigma-delta modulator of claim 14,
- wherein the third reference voltage is a greater than or equal to the first reference voltage,
- wherein the first reference voltage is greater than the second reference voltage, and
- wherein the second reference voltage is greater than or equal to the fourth reference voltage.

16. The sigma-delta modulator of claim 14, wherein the primary and secondary transistors are CMOS transistors of different type from each other.

17. A method of sigma-delta modulation, comprising:
- receiving an input voltage;
- modifying the input voltage based on a feedback value;
- integrating the modified input voltage to provide a first output voltage;
- converting the first output voltage to a first feed forward signal;
- comparing the first feed forward signal to a threshold value to produce the feedback value;
- determining whether the first output voltage has risen above a first voltage maximum value or fallen below a first voltage minimum value; and
- providing a first matching current to adjust the first output voltage if the first output voltage has risen above the first voltage maximum value or fallen below the first voltage minimum value.

18. The method of sigma-delta modulation, as recited in claim 17,
- wherein the first matching current reduces the first output voltage if the first output voltage has risen above the first voltage maximum value, and
- wherein the first matching current increases the first output voltage if the first output voltage has fallen below the first voltage minimum value.

19. The method of sigma-delta modulation, as recited in claim 17, further comprising:
- integrating the first output voltage to provide a second output voltage;
- converting the second output voltage to a second feed forward signal;
- comparing a sum of the first feed forward signal and the second feed forward signal to a threshold value to produce the feedback value;
- determining whether the second output voltage has risen above a second voltage maximum value or fallen below a second voltage minimum value; and
- providing a second matching current to adjust the second output voltage if the second output voltage has risen above the second voltage maximum value or fallen below the second voltage minimum value.

20. The method of sigma-delta modulation, as recited in claim 19,
- wherein the second matching current reduces the second output voltage if the second output voltage has risen above the second voltage maximum value, and
- wherein the second matching current increases the second output voltage if the second output voltage has fallen below the second voltage minimum value.

* * * * *